(12) United States Patent
Yu et al.

(10) Patent No.: US 9,152,035 B2
(45) Date of Patent: Oct. 6, 2015

(54) LITHOGRAPHIC PHOTOMASK WITH INCLINED SIDES

(71) Applicant: Taiwan Semiconductor Manufacturing Company, Ltd., Hsin-Chu (TW)

(72) Inventors: Ching-Fang Yu, Hsinchu (TW); Ting-Hao Hsu, Hsinchu (TW); Sheng-Chi Chin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 166 days.

(21) Appl. No.: 14/051,942

(22) Filed: Oct. 11, 2013

(65) Prior Publication Data

US 2015/0104731 A1    Apr. 16, 2015

(51) Int. Cl.
*G03F 1/22* (2012.01)
*G03F 1/24* (2012.01)

(52) U.S. Cl.
CPC .......................................... *G03F 1/22* (2013.01)

(58) Field of Classification Search
CPC ..................................... G03F 1/22; G03F 1/24

USPC .................................................. 430/5; 355/53
See application file for complete search history.

(56) References Cited

U.S. PATENT DOCUMENTS 6,537,844 B1 *   3/2003   Itoh .................................. 438/48

* cited by examiner

*Primary Examiner* — Stephen Rosasco
(74) *Attorney, Agent, or Firm* — Haynes and Boone, LLP (57) ABSTRACT

A lithographic process will use a mask or photomask. The photomask includes a first material layer, the first material layer providing a first outer surface of the photomask. The photomask also includes a second material layer over the first material layer, the second material layer providing a second outer surface of the photomask. The two outer surfaces are substantially in parallel and a distance between the two outer surfaces along a first axis perpendicular to the two outer surfaces defines a thickness of the photomask. Also, the two outer surfaces are connected by a plurality of sides, at least one of the sides is not perpendicular to the two outer surfaces and the at least one of the sides provides substantial area for holding the lithographic photomask.

20 Claims, 10 Drawing Sheets

LITHOGRAPHIC PHOTOMASK WITH INCLINED SIDES

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, the need to perform higher resolution lithography processes grows.

Photolithography processes utilize a mask (also referred to as a photomask or a reticle). A mask contains IC patterns to be printed on a substrate, such as a wafer. Any dust or contaminant particles attached to the surfaces of a mask may result in artifacts on the printed IC patterns. As IC features continue to shrink and the corresponding mask features become smaller, cleanliness in handling a mask during semiconductor manufacturing processes becomes more and more important.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
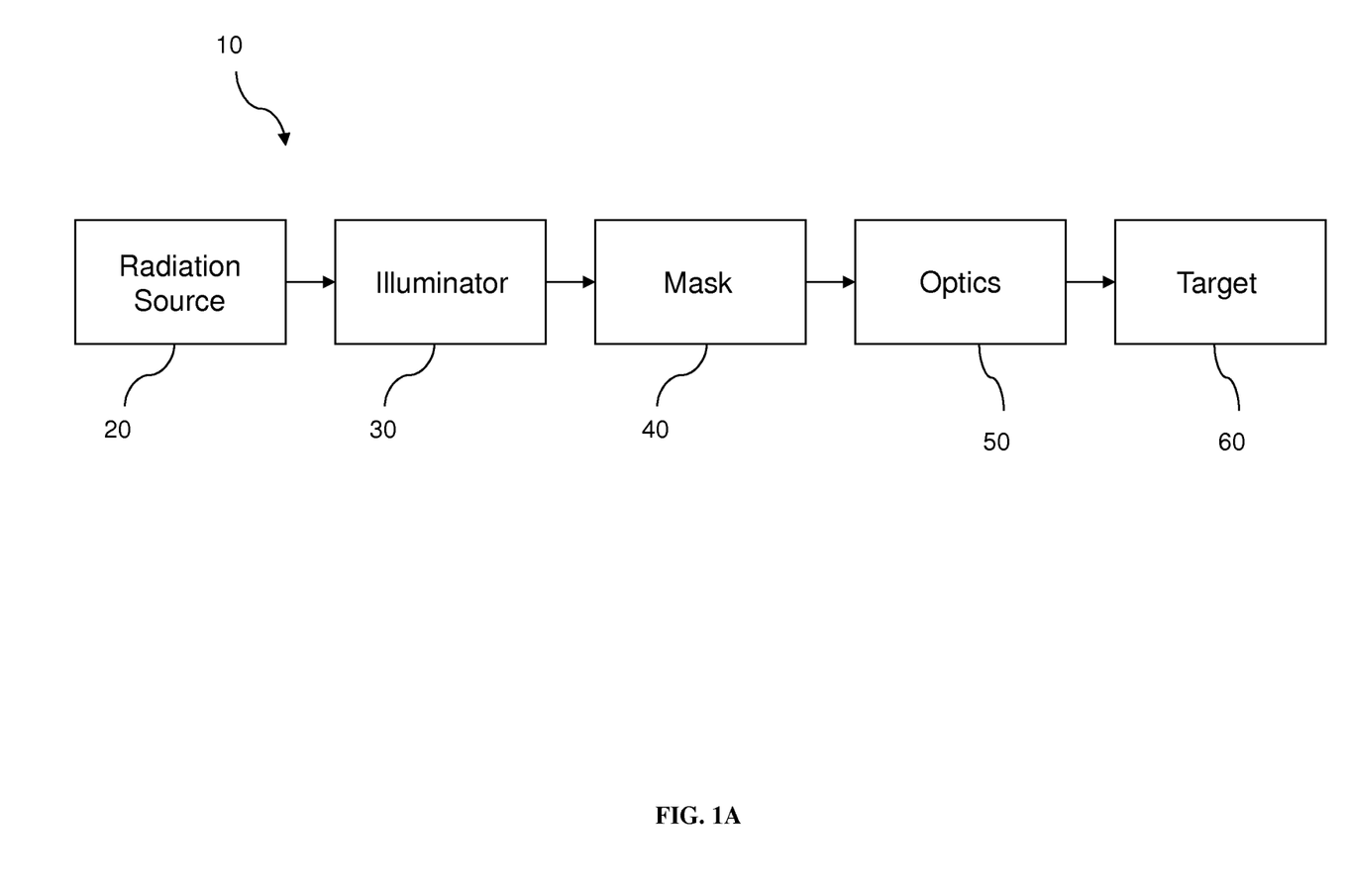
FIG. 1A is a block diagram of a lithography process for implementing one or more embodiments of the present disclosure.

Referring to FIG. 1A, a lithography process 10 that may benefit from one or more embodiments of the present invention is disclosed. For the sake of example, the following discussion will refer to an extreme ultraviolet (EUV) lithography for exposing a wafer on which one or more semiconductor devices are to be fabricated. However, the inventive scope of the present disclosure is not limited to EUV masks and one of ordinary skill in the art may apply the teachings in the present disclosure to other types of lithographic masks. The EUV lithography process 10 employs an EUV radiation source 20 having a wavelength of about 1-100 nm, including an EUV wavelength of about 13.5 nm.

The EUV lithography process 10 also employs an illuminator 30. The illuminator 30 may comprise refractive optics, such as a single lens or a lens system having multiple lenses (zone plates) and/or reflective optics, such as a single mirror or a mirror system having multiple mirrors, in order to direct light from the radiation source 20 onto a mask 40. In the EUV wavelength range, reflective optics is generally employed. Refractive optics, however, can also be realized by zoneplates. In the present embodiment, the illuminator 30 is set up to provide an on-axis illumination to illuminate a mask 40. In on-axis illumination, most all incoming light rays incident on the mask are at the same angle of incidence (AOI), e.g., AOI=6°, as that of a chief ray. In many situations, there may be some angular spread of the incident light. For example, the EUV lithography process 10 may utilize disk illumination (i.e., illumination on a pupil plane is shaped like a disk centered at the pupil center). Partial coherence a can also be used to describe a point source which produces a plane wave for illuminating the mask 40. In the present embodiment, it is sufficient to employ a nearly on-axis illumination having point sources with σ less than 0.3.

One exemplary mask 40 is a square plate that is 0.25 inch thick with 6 inches by 6 inches top and bottom surfaces. Its four sides form right angles with the top and bottom surfaces. A typical EUV mask is a reflective mask in that some portions of its top surface reflect radiation projected thereon in forming an aerial image of IC patterns to be printed on a wafer. Any defects or contaminant particles attached to the top surface of an EUV mask will have an adverse effect on the printing fidelity of the IC. Typically, a mask undergoes numerous operations where it is formed, patterned, and subsequently used to expose photoresist films on a wafer. Take an EUV mask as an example. Forming the EUV mask may include depositing a reflective multilayer (ML) structure over a substrate containing low thermal expansion material (LTEM), depositing an absorber layer over the ML structure, and other deposition and/or cleaning processes. Patterning the EUV mask may include photoresist coating, electron beam (e-beam) writing, photoresist developing, etching, cleaning, and other processes. Using the EUV mask to expose photoresist films on a wafer may include mounting the mask on a stage, aligning the mask, radiating the mask, and other operations. In addition, a mask is frequently inspected for defects and may be repaired for removing or mitigating defects. During the various operations aforementioned, it is critical that a mask is handled properly so as not to damage the mask or introduce defects to the mask. A mask may be handled or held by different methods and tools. For example, an EUV mask may be held by an electrostatic chuck (e-chuck) contacting its bottom surface. For example, a mask may be held by an up-down chuck clamping both its top and bottom surfaces, or by a side chuck clamping to at least two of its sides. These methods have their own limitations. For example, the e-chuck method requires a conductive layer deposited over the bottom surface of the mask. The up-down chuck may damage the top surface or introduce defects to the top surface during mask inspection or cleaning processes. The side chuck may not provide enough contacting areas with the mask. The present disclosure provides apparatus of mask structures that facilitate mask handling. The mask 40 may incorporate other resolution enhancement techniques such as phase-shifting mask (PSM) and/or optical proximity correction (OPC).

The EUV lithography system and process 10 also employs optics 50. The optics 50 may have refractive optics or reflective optics. The radiation reflected from the mask 40 (e.g., a patterned radiation) is collected by the optics 50.

The target 60 includes a semiconductor wafer with a photosensitive layer (e.g., photoresist or resist), which is sensitive to the EUV radiation. The target 60 may be held by a target substrate stage. The target substrate stage provides control of the target substrate position such that the image of the mask is scanned onto the target substrate in a repetitive fashion (though other lithography methods are possible).

Figure 1B:
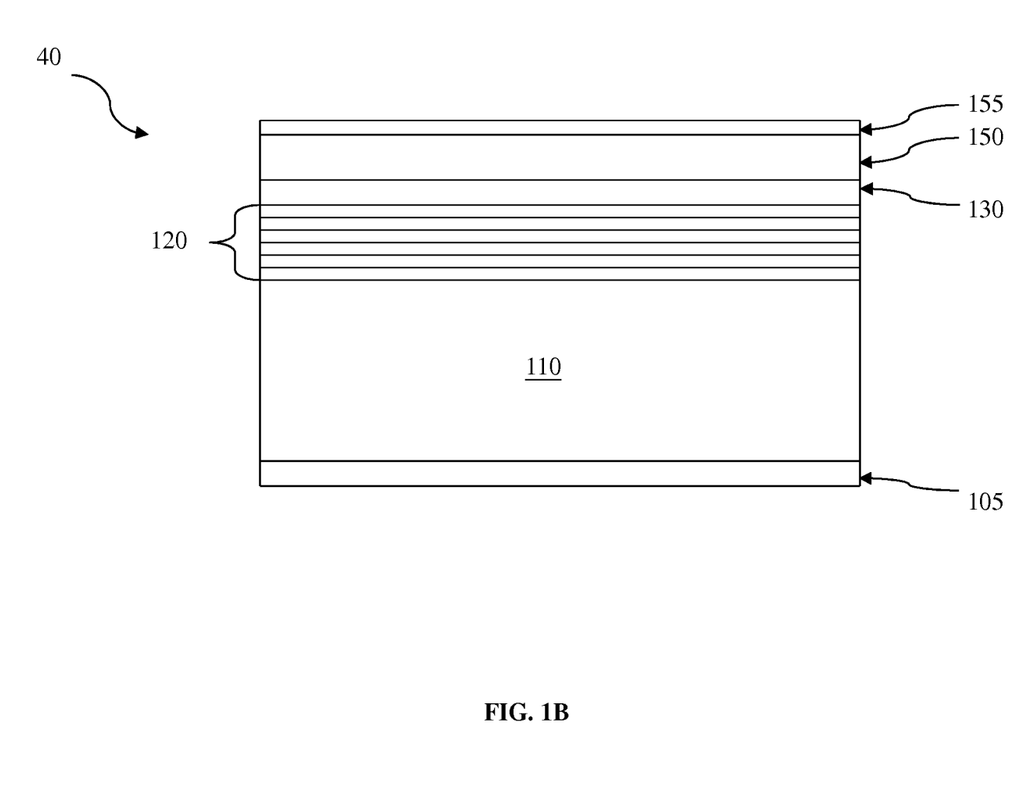
FIG. 1B illustrates a cross sectional view of an extreme ultraviolet (EUV) lithography mask according to various aspects of the present disclosure.

FIG. 1B illustrates a cross sectional view of a portion of the EUV mask 40 according to various aspects of the present disclosure. The EUV mask 40 includes a substrate 110, a reflective multilayer (ML) 120 deposited over the substrate 110, a capping layer 130 deposited over the reflective ML 120, an absorber layer 150 deposited over the capping layer 130, and a protection layer 155 deposited over the absorber layer 150. In addition, a conductive layer 105 may be deposited under the substrate 110, as shown in FIG. 1B, for electrostatic chucking purposes. In an embodiment, the conductive layer 205 includes chromium nitride (CrN). Other configurations and inclusion or omission of various items in the EUV mask 40 may be possible.

The substrate 110 serves to minimize image distortion due to mask heating by intensified EUV radiation. In some embodiments, the substrate 110 may include low thermal expansion material (LTEM). The LTEM may include fused silica, fused quartz, calcium fluoride ($CaF_2$), silicon carbide, silicon oxide-titanium oxide alloy and/or other suitable LTEM. The substrate 110 typically comprises a majority of the thickness of the EUV mask 40. For example, for a typical EUV mask that is few millimeters (mm) thick, all layers excluding the substrate 110, add up to only about few microns (µm) thick.

The reflective multilayer (ML) 120 is deposited over the LTEM substrate 110. The ML 120 includes a plurality of film pairs, such as molybdenum-silicon (Mo/Si) film pairs (e.g., a layer of molybdenum above or below a layer of silicon in each film pair). Alternatively, the ML 120 may include molybdenum-beryllium (Mo/Be) film pairs, or any two materials or two material combinations with large difference in refractive indices and small extinction coefficients. The thickness of each layer of the ML 120 depends on the wavelength and an incident angle of an EUV radiation projected onto the mask 40. For a specified incident angle, the thickness of each layer of the ML 120 may be adjusted to achieve maximal constructive interference for radiations reflected at different interfaces of the ML 120. A typical number of film pairs are 20-80, however any number of film pairs are possible. In an embodiment, the ML 120 includes 40 pairs of layers of Mo/Si. Each Mo/Si film pair has a thickness of about 7 nanometer (nm), e.g., about 3 nm for Mo and about 4 nm for Si. In this case, a reflectivity of about 70% is achieved.

The capping layer 130 is deposited over the ML 120. The capping layer 130 has different etching characteristics from the absorber layer 150 and acts as an etching stop layer in a patterning or repairing process of the absorber layer 150. In the present embodiment, the capping layer 130 includes ruthenium (Ru) or Ru compounds such as ruthenium-boron (RuB) or ruthenium-silicon (RuSi).

The absorber layer 150 is deposited over the capping layer 130. In the present embodiment, the absorber layer 150 absorbs an EUV radiation projected thereon. The absorber layer 150 may include a single layer or multiple layers from a group of chromium (Cr), chromium oxide (CrO), titanium nitride (TiN), tantalum nitride (TaN), tantalum (Ta), titanium (Ti), palladium, tantalum boron nitride (TaBN), aluminum oxide (AlO), molybdenum (Mo), or other suitable materials. In an embodiment, the absorber layer may be about 100 nm thick.

The protection layer 155 is deposited over the absorber layer 150, for example, to protect the absorber layer 150 from oxidation when the mask 40 is in a cleaning process. Furthermore, some of the absorber layer 150 may have poor cleaning resistance and the protection layer 155 can enhance the cleaning durability of the EUV mask 40. In the present embodiment, the protection layer 155 includes tantalum boron oxide (TaBO).

One or more of the layers 105, 120, 130, 150 and 155 may be formed by various methods, including physical vapor deposition (PVD) process such as evaporation and DC magnetron sputtering, a plating process such as electrode-less plating or electroplating, a chemical vapor deposition (CVD) process such as atmospheric pressure CVD (APCVD), low pressure CVD (LPCVD), plasma enhanced CVD (PECVD), or high density plasma CVD (HDP CVD), ion beam deposition, spin-on coating, metal-organic decomposition (MOD), and/or other methods.

Figure 2A:
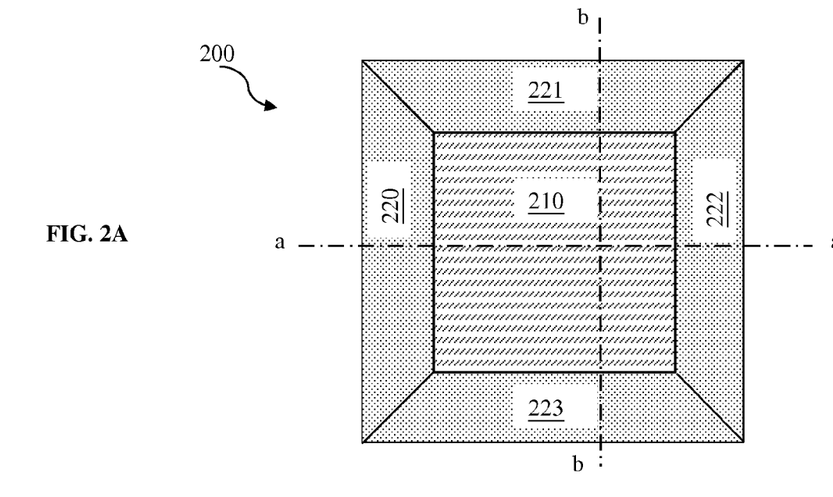
FIGS. 2A-2C illustrate top and cross sectional views of a lithographic mask according to various aspects of the present disclosure.

FIG. 2A illustrates a top view of another lithographic mask 200 according to various aspects of the present disclosure.

Figure 2B:
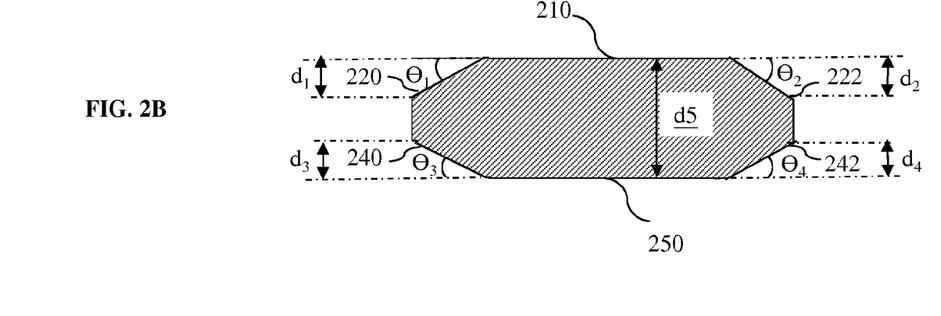
Figure 2C:
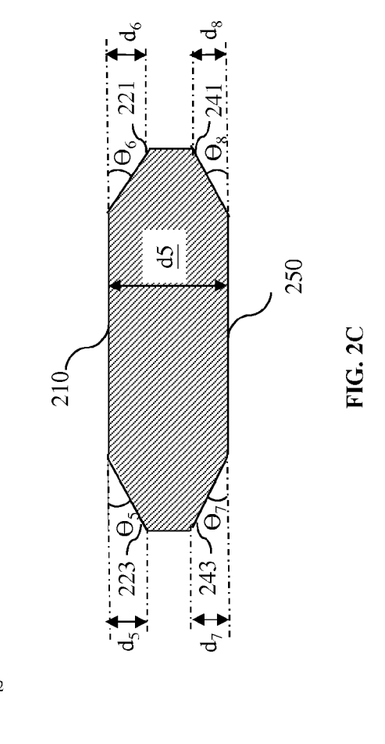

FIG. 2B is a cross sectional view of the mask 200 taken along a dotted a-a line of FIG. 2A. FIG. 2C is a cross sectional view of the mask 200 taken along a dotted b-b line of FIG. 2A. The mask 200 may be an EUV mask, such as the mask 40. Alternatively, the mask 200 may be a transmissive mask, a phase-shifting mask, a binary mask, or other types of mask.

Referring to FIG. 2A, the mask 200 includes a top surface 210 and four sides, 220-223, that connect the top surface 210 and incline downward and outward from the top surface 210. Referring to FIGS. 2B and 2C, the mask 200 further includes a bottom surface 250, which is parallel with the top surface 210, and four sides, 240-243, that connect the bottom surface 250 and incline upward and outward from the bottom surface 250. In an embodiment, the top surface 210 is to be patterned or has been patterned with an IC design layout to be transferred to wafers in a lithography process. It is apparent from the FIGS. 2A-2C that the mask 200 has a different structure than a typical mask in that at least one side of the mask 200 does not form a right angle with its top (or bottom) surface.

Referring again to FIG. 2B, the side 220 has a height $d_1$ and forms an exterior angle $\theta_1$ with the top surface 210. Similarly, the side 222 has a height $d_2$ and forms an exterior angle $\theta_2$ with the top surface 210, the side 240 has a height $d_3$ and forms an exterior angle $\theta_3$ with the bottom surface 250, and the side 242 has a height $d_4$ and forms an exterior angle $\theta_4$ with the bottom surface 250. In the present embodiment, each of the angles, $\theta_1$, $\theta_2$, $\theta_3$ and $\theta_4$ is substantially less than 90 degrees. Furthermore, in the present embodiment, the mask 200 has a thickness $d_5$, and each of the heights, $d_1$, $d_2$, $d_3$ and $d_4$, is less than half of the thickness $d_5$. The various angles and heights are selected so that the inclined sides 220-223 and 240-243 may provide enough contact area for holding the mask 200 by a tool, such as a chucking tool. In an embodiment, one or more of the inclined sides 220-223 and 240-243 may be used in conjunction with the bottom surface 250 in holding the mask 200. In an embodiment, the angles, $\theta_1$, $\theta_2$, $\theta_3$ and $\theta_4$ are greater than 10 degrees but less than 80 degrees. In an embodiment, the heights, $d_1$, $d_2$, $d_3$ and $d_4$, are greater than one sixteenth of the thickness $d_5$. In an embodiment, the mask 200 is an EUV mask, the thickness $d_5$ is about ¼ inch, each of the angles, $\theta_1$, $\theta_2$, $\theta_3$ and $\theta_4$ is about 45 degrees, and each of the heights, $d_1$, $d_2$, $d_3$ and $d_4$, is about 1/16 inch. The particular angles and heights disclosed in the present disclosure are mere examples and other angles and heights may be implemented depending on the type, size and shape of the mask 200.

FIG. 2C shows a cross sectional view taken along a dotted b-b line of FIG. 2A. In the present embodiment, the profile of the mask 200 in FIG. 2C is similar to that in FIG. 2B. In another embodiment, the two profiles may be different.

Figure 3:
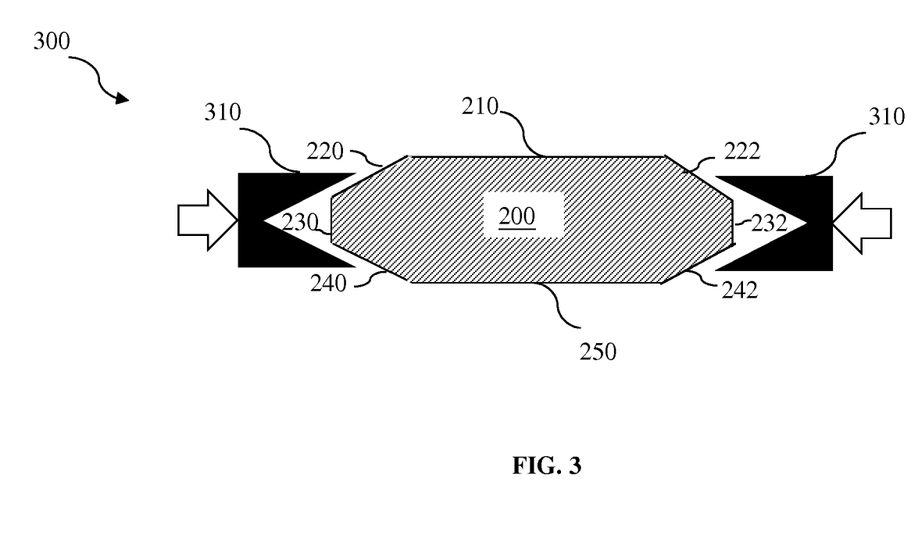
FIG. 3 illustrates an assembly having a chuck and a lithographic mask according to various aspects of the present disclosure.

The inclined sides 220-223 and 240-243 provide many benefits for handling the mask 200 during various manufacturing processes. One example is shown in FIG. 3. Referring to FIG. 3, an assembly 300 includes the mask 200 and a side chuck 310 according to various aspects of the present disclosure. The side chuck 310 is designed to clamp onto the inclined sides, 220, 222, 240 and 242, of the mask 200. Compared with a conventional side chuck that would clamp onto only vertical sides 230 and 232 of the mask 200, the side chuck 310 provides more contact area and more upward support for holding the mask 200. Unlike a conventional up-down chuck that would clamp onto the top and bottom surfaces of the mask 200, the side chuck 310 does not contact either the top surface 210 or the bottom surface 250. Therefore, the side chuck 310 does not damage the top and bottom surfaces of the mask 200 when pressure is applied to or removed from the mask 200 during clamping operations. In addition, the top and the bottom surfaces of the mask 200 will have less residual particles during cleaning operations, resulting in less contamination of both surfaces. Furthermore, the assembly 300 facilitates inspecting the mask 200 as there are no obstructions on both the top and the bottom surfaces. In an embodiment, the side chuck 300 may simultaneously clamp onto the inclined sides 220, 222, 240 and 242 (FIG. 2B) and the inclined sides 221, 223, 241 and 243 (FIG. 2C).

Figure 4:
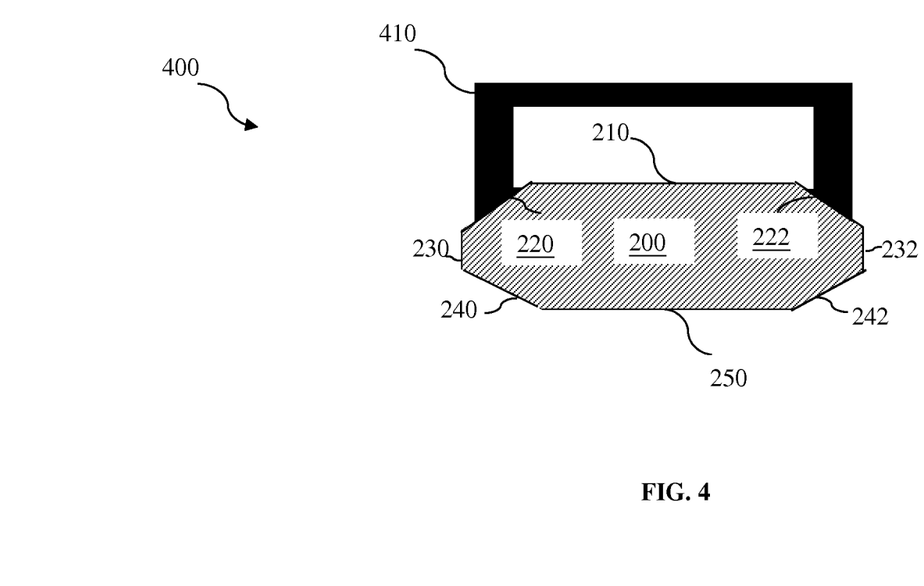
FIG. 4 illustrates an assembly having a cover and a lithographic mask according to various aspects of the present disclosure.

FIG. 4 illustrates another example of utilizing the inclined sides of the mask 200. Referring to FIG. 4, an assembly 400 includes a protective cover 410 and the mask 200. The protective cover 410 is supported by the inclined sides 220 and 222. Although not shown, the protective cover 410 may be simultaneously supported by the inclined sides 221 and 223 (FIG. 2A). In an embodiment, the protective cover 410 is an assembly of a pellicle frame and a pellicle for preventing or minimizing the impact of particles on the mask surface 210 to be transferred as undesirable pattern to a wafer in a lithography process. Alternatively, the protective cover 410 may be used when storing the mask 200 in a storage unit.

Figure 5A:
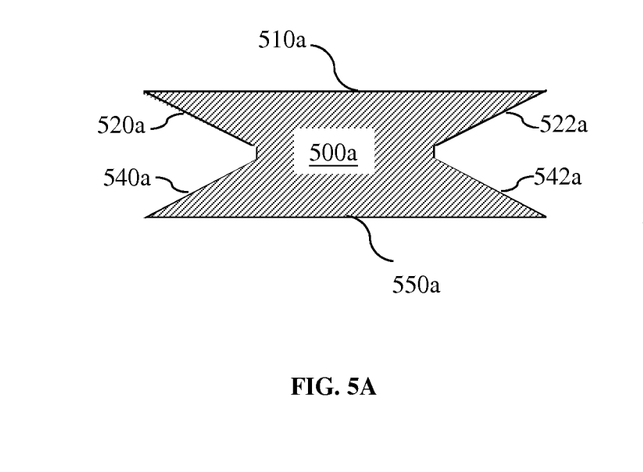
FIGS. 5A-5B illustrate cross sectional views of lithographic masks according to various aspects of the present disclosure.
Figure 5B:
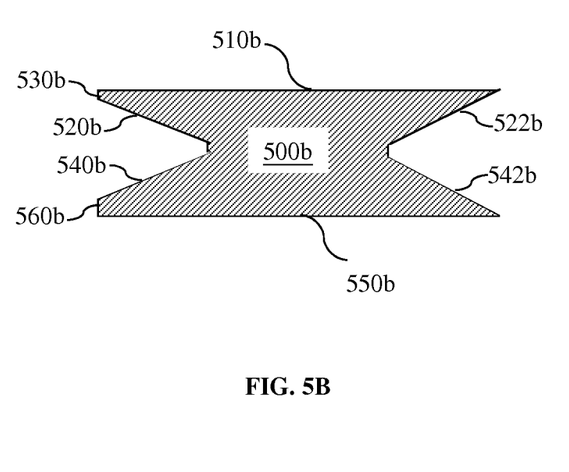

FIG. 5A illustrates a cross sectional view of a mask 500a according to various aspects of the present disclosure. Referring to FIG. 5A, the mask 500a includes a top surface 510a, a bottom surface 550a and four inclined sides 520a, 522a, 540a and 542a. The mask 500a may be viewed as a variant of the mask 200 (FIG. 2A) with the inclined sides 520a, 522a, 540a and 542a extending inward rather than outward. FIG. 5B illustrates a cross sectional view of a mask 500b according to various aspects of the present disclosure. Referring to FIG. 5B, the mask 500b includes a top surface 510b, a bottom surface 550b, four inclined sides 520b, 522b, 540b and 542b, and two vertical sides 530b and 560b. The mask 500b is similar to the mask 500a except that the inclined sides 520b and 540b do not directly connect the top surface 510b and the bottom surface 550b.

Figure 6:
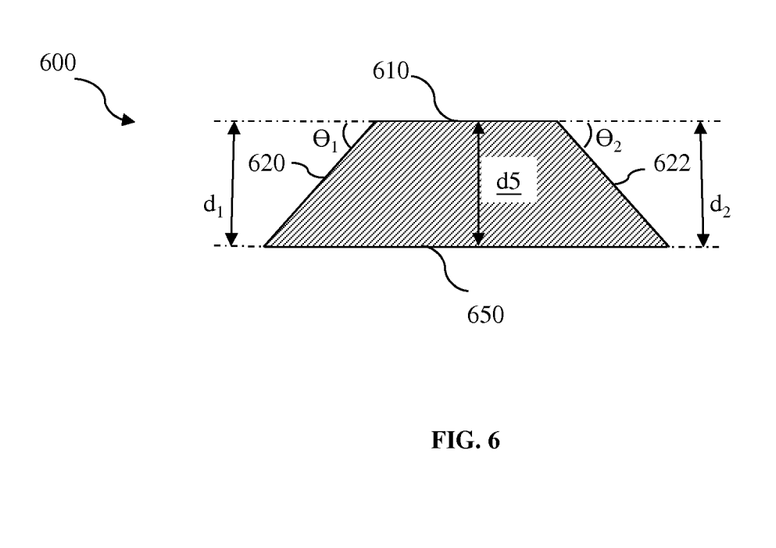
FIG. 6 illustrates a cross sectional views of a lithographic mask according to various aspects of the present disclosure.

FIG. 6 illustrates a cross sectional view of a mask 600 according to various aspects of the present disclosure. Referring to FIG. 6, the mask 600 includes a top surface 610, a bottom surface 650 and two inclined sides 620 and 622. The mask 600 may be viewed as a variant of the mask 200 (FIG. 2A) with the inclined sides 240 and 242 degenerated ($d_3=d_4=0$).

Figure 7:
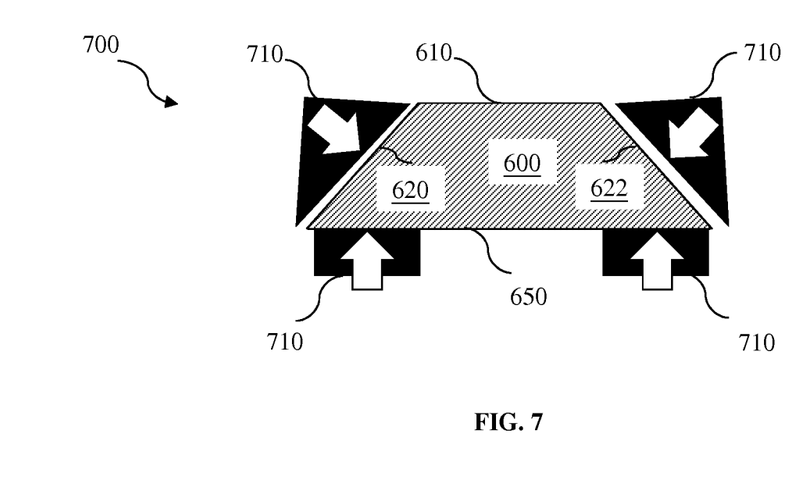
FIG. 7 illustrates an assembly having a chuck and a lithographic mask according to various aspects of the present disclosure.

FIG. 7 illustrates an assembly 700 according to various aspects of the present disclosure. Referring to FIG. 7, the assembly 700 includes a chuck 710 and the mask 600. The chuck 710 clamps to the bottom surface 650 and the inclined sides 620 and 622. Consequently, the chuck 710 does not damage or introduce contaminant particles to the top surface 610 as typically does by a conventional up-down chuck. In an embodiment, the chuck 710 is a mechanical chuck.

Figure 8A:
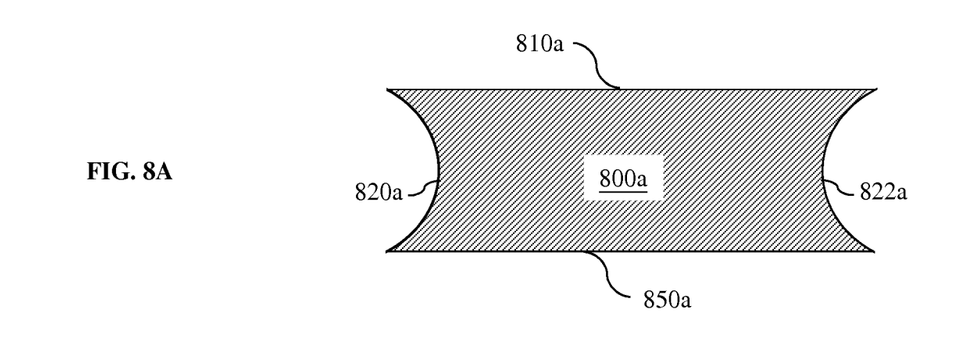
FIGS. 8A and 8B illustrate cross sectional views of lithographic masks according to various aspects of the present disclosure.
Figure 8B:
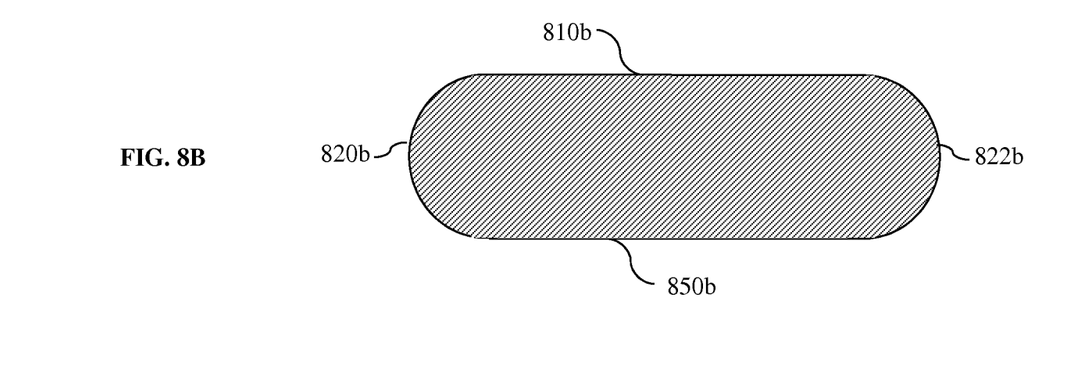

FIGS. 8A and 8B illustrate cross sectional views of a mask 800a and a mask 800b respectively according to various aspects of the present disclosure. Referring to FIG. 8A, the mask 800a has inclined sides 820a and 822a between its top surface 810a and bottom surface 850a. The inclined sides 820a and 822a are curved sides extending inward. Referring to FIG. 8B, the mask 800b has inclined sides 820b and 822b between its top surface 810b and bottom surface 850b. The inclined sides 820b and 822b are curved sides extending outward. As illustrated in FIGS. 8A and 8B, both the masks 800a and 800b includes substantially non-vertical sides between their respective top and bottom surfaces.

Figure 9A:
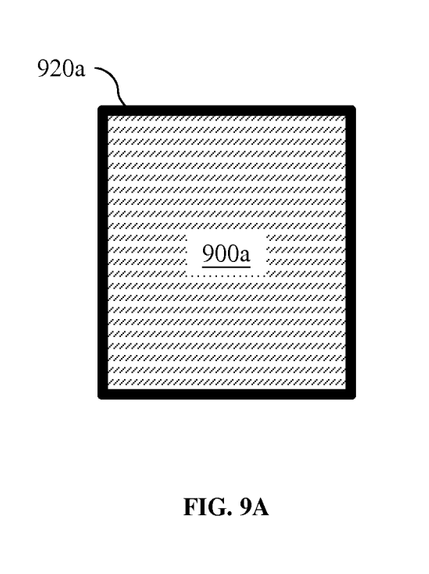
FIGS. 9A-9C illustrate top views of lithographic masks according to various aspects of the present disclosure.
Figures 9B, 9C:
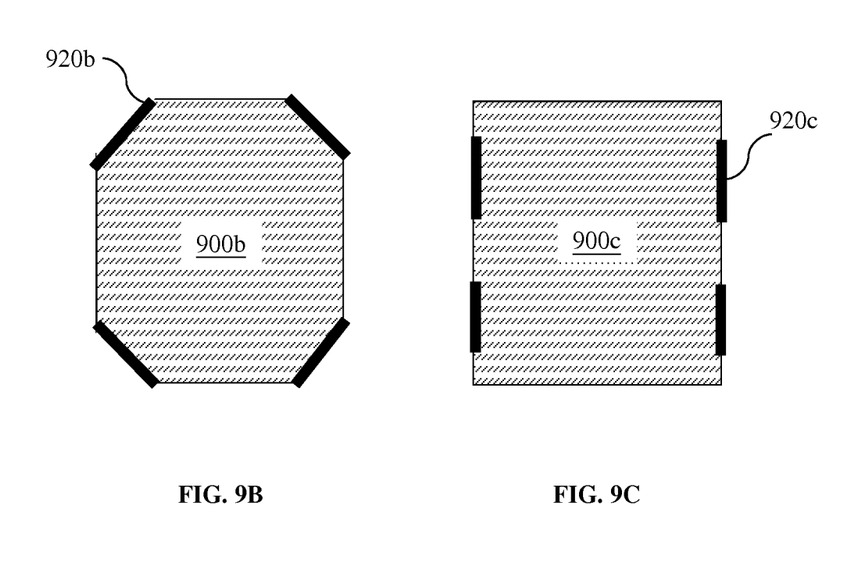

FIGS. 9A-9C illustrate top views of different embodiments of masks with inclined sides according to various aspects of the present disclosure. As shown in FIGS. 9A-9C, an inclined side may be at different positions or have different configurations relative to a top (or bottom) surface of a mask. FIG. 9A shows a mask 900a with four inclined sides 920a that connect and fully enclose its top surface. FIG. 9B shows a mask 900b with four inclined sides 920b that chamfer the four corners of its top surface. FIG. 9C shows a mask 900c with four inclined edges 920c that connect and partially enclose its top surface. The inclined sides 920a, 920b, and 920c may take forms such as shown in FIGS. 2B, 2C, 5A, 5B, 6, 8A and 8B, or may take any other forms according to the principles thus far disclosed.

In one exemplary aspect, the present disclosure is directed to a lithographic photomask. The photomask includes a first material layer and a second material layer over the first material layer. The first material layer provides a first outer surface of the photomask. The second material layer provides a second outer surface of the photomask. The two outer surfaces are substantially in parallel. A distance between the two outer surfaces along an axis perpendicular to the two outer surfaces defines a thickness of the photomask. The two outer surfaces are connected by a plurality of sides and at least one of the sides is not perpendicular to the two outer surfaces. The at least one of the sides provides substantial area for holding the lithographic photomask.

In another exemplary aspect, the present disclosure is directed to a lithographic photomask having a substrate and a material layer over the substrate. The photomask includes a first outer surface in a first horizontal plane, wherein the first outer surface is in a substantially rectangular shape having a first edge and a second edge and the first edge is substantially in parallel to the second edge. The photomask further includes a second outer surface in a second horizontal plane, wherein the second outer surface is in a substantially rectangular shape having a third edge and a fourth edge, the third edge is substantially in parallel to the fourth edge, and a distance between the first and the second outer surfaces along a vertical axis defines a thickness of the photomask. The photomask further includes a first side, wherein the first side connects the first outer surface at the first edge thereby forming a first angle with the first outer surface and the first side has a first vertical height. The photomask further includes a second side, wherein the second side connects the first outer surface at the second edge thereby forming a second angle with the first outer surface and the second side has a second vertical height. The photomask further includes a third side, wherein the third side connects the second outer surface at the third edge thereby forming a third angle with the second outer surface and the third side has a third vertical height. The photomask further includes a fourth side, wherein the fourth side connects the second outer surface at the fourth edge thereby forming a fourth angle with the second outer surface and the fourth side has a fourth vertical height. The first, second, third, and fourth angles are substantially different from a right angle. The first, second, third, and fourth sides provide substantial area for holding the lithographic photomask.

In another exemplary aspect, the present disclosure is directed to an extreme ultraviolet (EUV) mask. The EUV mask includes a low thermal expansion material (LTEM) substrate, a reflective multilayer (ML) over the substrate, a capping layer over the reflective ML, and an absorber layer over the capping layer. The substrate has a first surface in a horizontal plane, a second surface in another horizontal plane, and a plurality of non-vertical sides between the two surfaces. The plurality of non-vertical sides provides substantial area for holding the mask.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A lithographic photomask comprising:
   a first material layer, the first material layer providing a first outer surface of the photomask; and
   a second material layer over the first material layer, the second material layer providing a second outer surface of the photomask,
   wherein:
   the two outer surfaces are substantially in parallel and a distance between the two outer surfaces along a first axis perpendicular to the two outer surfaces defines a thickness of the photomask;
   the two outer surfaces are connected by a plurality of sides;
   at least one of the sides is not perpendicular to the two outer surfaces; and
   the at least one of the sides provides substantial area for holding the lithographic photomask.

2. The photomask of claim 1, wherein the at least one of the sides connects at least one from the group consisting of: the first outer surface and the second outer surface.

3. The photomask of claim 1, wherein the at least one of the sides is from the group consisting of: a planar side and a curved side.

4. The photomask of claim 1, wherein an angle between a plane that is in parallel to at least one of the sides and a plane that is in parallel to the first outer surface is about 45 degrees.

5. The photomask of claim 1, wherein the first and the second outer surfaces are substantially rectangular.

6. The photomask of claim 1, wherein a height of the at least one of the sides along a second axis perpendicular to the two outer surfaces is about one fourth of the thickness.

7. The photomask of claim 1, wherein:
   the photomask is an extreme ultraviolet (EUV) mask;
   the first material layer is a substrate having a low thermal expansion material (LTEM); and
   the second material layer includes one or more from the group consisting of chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, and molybdenum,
   further comprising:
   a reflective multilayer (ML) over the substrate; and
   a capping layer over the reflective ML and under the second material layer.

8. The photomask of claim 1, wherein the photomask is an extreme ultraviolet (EUV) mask, further comprising:
   a low thermal expansion material (LTEM) substrate over the first material layer;
   a reflective multilayer (ML) over the substrate; and
   a capping layer over the reflective ML and under the second material layer.

9. The photomask of claim 1, wherein the second material layer includes integrated circuit (IC) patterns to be transferred to wafers in a lithography process.

10. A lithographic photomask having a substrate and a material layer over the substrate, comprising:
- a first outer surface in a first horizontal plane, wherein the first outer surface is in a substantially rectangular shape having a first edge and a second edge and the first edge is substantially in parallel to the second edge;
- a second outer surface in a second horizontal plane, wherein the second outer surface is in a substantially rectangular shape having a third edge and a fourth edge, the third edge is substantially in parallel to the fourth edge, and a distance between the first and the second outer surfaces along a vertical axis defines a thickness of the photomask;
- a first side, wherein the first side connects the first outer surface at the first edge thereby forming a first angle with the first outer surface and the first side has a first vertical height;
- a second side, wherein the second side connects the first outer surface at the second edge thereby forming a second angle with the first outer surface and the second side has a second vertical height;
- a third side, wherein the third side connects the second outer surface at the third edge thereby forming a third angle with the second outer surface and the third side has a third vertical height; and
- a fourth side, wherein the fourth side connects the second outer surface at the fourth edge thereby forming a fourth angle with the second outer surface and the fourth side has a fourth vertical height, wherein:
- the first, second, third, and fourth angles are substantially different from a right angle; and
- the first, second, third, and fourth sides provide an area for holding the lithographic photomask.

11. The photomask of claim 10, wherein:
the first and second vertical heights are about the same as the thickness.

12. The photomask of claim 10, wherein the first, second, third and fourth angles are about 45 degrees each.

13. The photomask of claim 10, wherein the first, second, third and fourth vertical heights are about one fourth of the thickness each.

14. The photomask of claim 10, wherein the first, second, third and fourth edges are substantially in parallel.

15. The photomask of claim 10, wherein the first outer surface is a surface of the substrate and the second outer surface is a surface of the material layer.

16. The photomask of claim 15, wherein the material layer includes integrated circuit (IC) patterns to be transferred to wafers in a lithography process.

17. The photomask of claim 10, wherein the photomask is an extreme ultraviolet (EUV) mask, the substrate is a low thermal expansion material (LTEM) substrate, and the first outer surface is a surface of a coating layer under the substrate, further comprising:
- a reflective multilayer (ML) over the substrate; and
- a capping layer over the reflective ML and under the material layer.

18. An extreme ultraviolet (EUV) mask, comprising:
- a low thermal expansion material (LTEM) substrate, wherein the substrate has a first surface in a horizontal plane; a second surface in another horizontal plane; and a plurality of non-vertical sides between the two surfaces, the plurality of non-vertical sides providing substantial area for holding the mask;
- a reflective multilayer (ML) over the second surface;
- a capping layer over the reflective ML; and
- an absorber layer over the capping layer.

19. The EUV mask of claim 18, further comprising a coating layer under the LTEM substrate.

20. The EUV mask of claim 18, wherein the absorber layer includes one or more from the group consisting of chromium, chromium oxide, chromium nitride, titanium, titanium oxide, titanium nitride, tantalum, tantalum oxide, tantalum nitride, tantalum oxynitride, tantalum boron nitride, tantalum boron oxide, tantalum boron oxynitride, aluminum, aluminum-copper, aluminum oxide, silver, silver oxide, palladium, ruthenium, and molybdenum.

* * * * *